United States Patent
Talanov et al.

(10) Patent No.: US 7,102,363 B2
(45) Date of Patent: Sep. 5, 2006

(54) METHOD AND SYSTEM FOR NON-CONTACT MEASUREMENT OF MICROWAVE CAPACITANCE OF MINIATURE STRUCTURES OF INTEGRATED CIRCUITS

(75) Inventors: Vladimir V. Talanov, Ellicott City, MD (US); Andrew R. Schwartz, Bethesda, MD (US)

(73) Assignee: Neocera, Inc., Beltsville, MD (US)

( * ) Notice: Subject to any disclaimer, the term of this patent is extended or adjusted under 35 U.S.C. 154(b) by 73 days.

(21) Appl. No.: 11/137,550

(22) Filed: May 26, 2005

(65) Prior Publication Data

US 2005/0225333 A1 Oct. 13, 2005

Related U.S. Application Data

(63) Continuation-in-part of application No. 10/717,448, filed on Nov. 21, 2003, now Pat. No. 6,943,562.

(51) Int. Cl.
*G01R 27/32* (2006.01)

(52) U.S. Cl. .................. 324/639; 324/633; 324/765

(58) Field of Classification Search ............... 324/633, 324/639, 765
See application file for complete search history.

(56) References Cited

U.S. PATENT DOCUMENTS 5,218,294 A * 6/1993 Soiferman ............... 324/158.1
6,034,535 A    3/2000 Liberman et al.
6,097,205 A    8/2000 Liberman et al.
6,163,163 A   12/2000 Kohn et al.
6,239,603 B1 * 5/2001 Ukei et al. ................. 324/763
6,617,864 B1 * 9/2003 Inoue et al. ................ 324/754

* cited by examiner

*Primary Examiner*—Walter Benson
(74) *Attorney, Agent, or Firm*—Rosenberg, Klein & Lee

(57) ABSTRACT

A method and system for non-contact measurements of microwave capacitance of miniature structures patterned on wafers used for production of modern integrated circuits. A near-field balanced two-conductor probe is brought into close proximity to a test key built on a wafer of interest and replicating the miniature structure of interest. The resonant frequency of the probe for the test key is measured. The probe is then positioned at the same distance from an "open" calibration key and "short" calibration key, and the resonance frequencies of the probe for the calibration keys are measured. A shear force distance control mechanism maintains the distance between the tip of the probe and the measured test key and calibration keys. The microwave capacitance of the test key is then calculated in accordance with a predefined formula. The obtained microwave capacitance of the test key is indicative of the capacitance of the miniature structure of interest and may be further used for determining possible defects of the integrated circuit of interest.

20 Claims, 4 Drawing Sheets

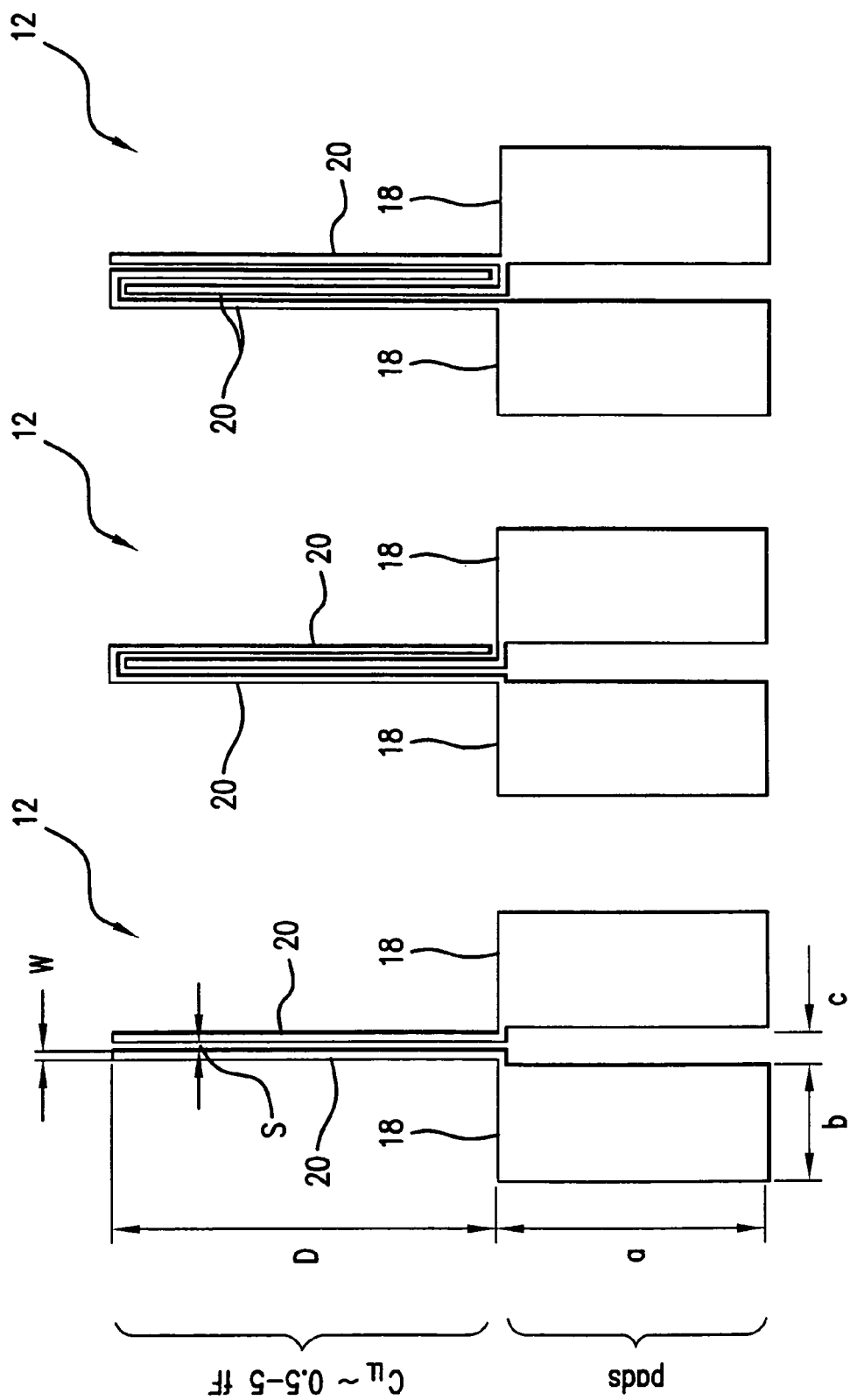

METHOD AND SYSTEM FOR NON-CONTACT MEASUREMENT OF MICROWAVE CAPACITANCE OF MINIATURE STRUCTURES OF INTEGRATED CIRCUITS

REFERENCE TO RELATED APPLICATIONS

This Utility Patent Application is a Continuation-in-Part of the patent application Ser. No. 10/717,448, filed 21 Nov. 2003 now U.S. Pat. No. 6,943,562.

FIELD OF THE INVENTION

The present invention relates to measurement techniques. In particular, this invention directs itself to a technique for non-contact measurement of microwave capacitance of miniature structures of integrated circuits using near field microwave probes. The concept is based on microwave measurements employing a balanced two-conductor transmission line resonator to obtain microwave capacitance of miniature structures in order to monitor integrated circuits fabrication processes.

More in particular, the present invention directs itself to the non-contact measurement of interelectrode (interline) capacitances using miniature metallized test structures (test keys) built on a wafer under test. The test key includes metallic pads and testing wires extending from the pads. The test key wires replicate typical wires found in an integrated circuit under test.

Furthermore, the present invention is directed to a method and system for non-contact measurement of microwave capacitance of miniature test structures which do not require knowledge of probe geometry or the absolute distance from the tip of the probe to the test structure. The microwave capacitance of the test structure is calculated based on measured resonant frequencies of the near field microwave probe for the miniature test structure and miniature calibration keys. The distance between the near field microwave probe and the calibration keys is maintained substantially equal to the distance between the near field microwave probe and the test structure by a distance control mechanism during the testing.

BACKGROUND OF THE INVENTION

A fundamental shift is taking place in the fabrication of integrated circuits, and in particular in the construction of the multiple wiring layers that provide connections to the tens of millions of transistors on a state-of-the-art chip. The prior standard in the industry has been the use of aluminum wires isolated each from the other by silicon dioxide. Despite the prior success of this combination, such is now reaching the limitation imposed by state-of-the-art chips and is now placing limitations on the performance of the chips. In order to obviate these limitations, the semiconductor industry has begun a search for replacements for aluminum and/or silicon dioxide that can provide enhanced device performance.

Two shifts in fabrication of integrated circuits are currently taking place: (1) from aluminum to copper wires to reduce the resistance of the metal wires, and (2) from silicon dioxide to dielectrics with lower dielectric constants k, commonly referred to as 'low-k' materials. The move away from silicon dioxide as the interlayer dielectric has been driven by the need to reduce the delay times along the wires in the complex circuits. This has opened up a wide field of research and development in the semiconductor industry focused on the fabrication and characterization of new high-performance materials.

However, the stable, well-understood nature of silicon dioxide has led to an absence of effective tools and methods for characterizing dielectric materials. As a result, progress toward the identification and optimization of new dielectric materials has been slowed by the lack of characterization instruments.

In standard aluminum/silicon dioxide processes, the wiring layers are formed by first laying down a uniform aluminum film, etching away the aluminum in the regions between the wires, and then filling these regions with silicon dioxide. The switch from aluminum to copper has caused a change in this process since there is no effective way to etch copper. Thus, for copper/dielectric based integrated circuits, the Dual Damascene process is generally employed, in which two layers of dielectric material (either silicon dioxide or a low-k dielectric) are initially deposited. The dielectric layers are then etched to form vias and trenches where the wires are to be formed. The copper is then deposited into these trenches and vias. Chemical mechanical polishing (CMP) is then applied to produce a smooth surface on which the process steps can be repeated for the next wiring layer.

The Damascene process has been somewhat successful, but has also led to a wide range of problems that were not encountered in the standard Al/SiO$_2$ technology. These problems have been particularly common when the typically less-stable low-k dielectrics are used. As an example, the dielectric etching process necessary to form the trenches for copper often damage the dielectric material causing a change in its dielectric constant, and as a consequence, a change in the performance of the device. This type of damage often occurs at the interface between the metal and dielectric and causes changes in the capacitance between wires, thus affecting device performance.

There is a clear need for dielectric metrology to be used on product wafers during manufacturing of integrated circuits and the like. The existing techniques for dielectric constant measurements of low-k films include Hg-probe, MIS-capacitance, and Corona discharge.

These techniques are able to measure k value on blanket wafers, however they cannot be used on production wafers. Moreover, Hg-probe and MIS-capacitance are not appropriate for measurements on porous dielectrics. In addition neither of the above techniques can be employed to monitor low-k dielectrics during processing.

Measuring capacitance is an important step in monitoring the fabrication process of integrated circuits. The standard method for accomplishing this task is to build large capacitance test structures directly into the device itself and then measure the capacitance of these structures by making direct contact, either through pins on the finished device or by placing small probes on contact pads.

Interdigitated comb is now a standard parametric in-line test and more representative of true low-k process metrology. However, it involves extensive sample cross-sectioning and numerical modeling, thus making the data collection unrealistically time-consuming. In addition, traditional capacitance measurements require test structures with capacitances on the order of 1–100 pF so as to overcome the stray capacitances in the measurement wires. This requirement means that interdigitated comb structures must be fairly large since the typical specific capacitance between wires in state-of-the-art integrated circuits is less than 1 fF/µm. There are three distinct disadvantages to such large capacitance test structures. First, the structures take up significant area on the wafer, which particularly undesirable on production wafers. Second, the large size of the test structure leads to significant stray capacitance between the structure and nearby structures with the stray capacitance being very difficult to account for in the analysis. Third, the large size of the structure means that the properties of interest are being averaged over large areas and therefore cannot be studied locally on the scale of the wires themselves. It therefore would be highly desirable to have a non-contact technique for capacitance measurement on miniature test structures.

SUMMARY OF THE INVENTION

It is an object of the present invention to provide a technique for non-contact measurement of microwave capacitance of miniature structures of integrated circuits by measuring small test keys built on the wafer under test with the test keys replicating the structures of interest.

It is another object of the present invention to perform non-contact measurements of the microwave capacitance of test structures with the use of a near field balanced two-conductor microwave probe. The measurement is made at any point in the fabrication process without making contact with the structures of interest or the test structures which may be very small (a few microns or less), and where the measurement is sensitive to extremely small changes in capacitance.

It is a further object of the present invention to measure capacitance of test keys which have pads and wires replicating miniature structures of interest of the circuit under study. The capacitance of the test keys is calculated based on measuring the resonant frequencies of the Near Field Microwave Probe for the test keys as well as for calibration keys built in proximity to the test keys on the wafer under study. The test keys' capacitance is representative of the capacitance of the structure of interest.

It is a further object of the present invention to provide a method and apparatus for measurement of microwave capacitance of miniature structures of interest with near field microwave probes which employ an independent distance control mechanism for maintaining the tip of the probe at an unknown distance from the miniature test structure but nominally equal to the distance of the tip from the calibration keys.

In accordance with the principles herein described, the present invention defines a method for non-contact measurement of microwave capacitance of a miniature structure of integrated circuits, which includes the steps of:
building at least one test key on a wafer under test;
positioning a near field microwave probe at a predetermined distance from the test key,
measuring a resonant frequency $F_{tot}$ of said near-field microwave probe for the test key,
building an "open" calibration key in proximity to the test key,
positioning said near-field microwave probe at the predetermined distance from the "open" calibration key,
measuring a resonant frequency $F_{op}$ of the near-field microwave probe for the "open" calibration key,
building a "short" calibration key in proximity to the test key and the "open" calibration key,
positioning the near field microwave probe at the predetermined distance from the "short" calibration key,
measuring a resonant frequency $F_{sh}$ of the near-field microwave probe for the "short" calibration key, and
calculating the microwave capacitance of the test key based on the measured resonant frequencies.

Thus calculated capacitance of the test key is representative of the capacitance of the miniature structure of interest.

The near-field microwave probe is directed to a balanced two-conductor transmission line resonator which includes a pair of conductors extending in spaced relationship therebetween and separated by a dielectric media.

The test keys can be built anywhere on the wafer where the capacitance is to be measured. However, the most appropriate position of the test keys is the scribe line between the chips on the wafer. The test key includes a pair of pads and wires extending from the pads. The wire dimensions (both wire width and separation, as well as the length and the shape) are designed to match the wires of interest in the device under consideration. Preferably, several test keys having wires of different lengths are built in close proximity each to the other and are measured.

The "short" and "open" calibration keys are built on the wafer. Each calibration key includes a pair of pads which are either shorted each to the other or are separate. The "short" and "open" calibration keys should be built on the same wafer as the test keys and preferably are to be located in close proximity to the test keys in order that the material properties can be assumed to be the same as of the test keys.

The dimensions of the pads of the test keys, as well as the pads of the "short" and "open" calibration keys, are determined based on the dimensions of the near field microwave probe employed for measurements. The dimensions of the wires of the test keys match the wires of interest in the integrated circuit under test. In this manner, the capacitance measured on the test keys is representative of the capacitance between lines of interest in the integrated circuits under test.

The distance between the near-field microwave probe and the test keys is maintained equal to the predetermined (but unknown) separation between the near-field microwave probe and the calibration keys by a closed-loop distance control mechanism which may include a shear force-based or atomic force distance control mechanism with the distance being maintained below 50–100 nm.

The resonant frequencies $F_{tot}$, $F_{op}$ and $F_{sh}$ are obtained by techniques known to those skilled in the art.

The miniature test keys may include a pair of parallel wires replicating the wires of circuit of interest. However, if the length of the wires of the integrated circuit of interest is large and there is need to keep the overall size of the test key small, the wires of the test key can be "folded over" to form, for example, a "comb" or "interdigital" capacitor.

The line-to-line capacitance $C_{LL}$ is calculated in accordance with the Equation (1):

$$C_{LL} = \frac{\left(1 - 2F_{sh}L\sqrt{\varepsilon_0\mu_0\varepsilon_{\it{eff}}}\right)^2}{2Z_0} \frac{(F_{op} - F_{tot})}{(F_{op} - F_{sh})(F_{sh} - F_{tot})} \quad (1)$$

where $F_{op}$ is the resonant frequency for the "open" calibration key, $F_{sh}$ is the resonant frequency for the "short" calibration key, and $F_{tot}$ is the resonant frequency for test key replicating the structure of interest.

A series of test keys with different values D (length of the wires of the test key) built on the wafer under study are tested for a given width/separation of the wires of the test key, and the $C_{LL}$ is measured for each value D. The measured $C_{LL}$ further is plotted as a function of the test key length D. From this dependence the specific capacitance of the test key (i.e. the capacitance $C_{LL}$ per unit length) is extracted.

The calculated microwave line-to-line capacitance $C_{LL}$ may be further used in fabrication quality control by comparing the $C_{LL}$ with a predetermined capacitance value and judging whether the integrated circuit of interest is defective based on a deviation of the $C_{LL}$ from the predetermined capacitance value.

The present invention is also a system for non-contact measurement of microwave capacitance of miniature structures of integrated circuits, which includes
a miniature structure of interest on a wafer,
a near-field microwave probe having a tip, and
at least one miniature test key built on the wafer.

Preferably, a plurality of test keys distinct one from another by their geometric properties, are built on the wafer in proximity one to another. Each test key has metallic pads and wires replicating the miniature structure of interest and extend from the metallic pads. The test key wires have dimensions (wire width separation and length) designed to fall in a range of the dimensions of the wires of interest of the integral circuit under study. The test keys are placed preferably in an area on the wafer called a "scribe line" between the chips on the wafer.

The metallic pads are designed in accordance with the dimensions of the probe tip, and are at least equal to or larger than the cross-section of the tip of the near-field microwave probe.

The system for non-contact measurement of the present invention further comprises "open" and "short" calibration keys which are built on the wafer under test in close proximity to the test keys. Each calibration key includes pads having dimensions coinciding with the dimensions of the pads of the test keys. The calibration keys are used for calibration purposes in the measurement scheme of the present invention.

A shear force-based (or atomic force based) distance control unit is operatively coupled to the near-field microwave probe to control tip-to-pads separation. An acquisition mechanism is employed for acquiring resonant frequency of the near-field microwave probe for each test key and the resonant frequency of the near-field microwave probe for the calibration "open" and "short" keys. A processing mechanism calculates the microwave line-to-line capacitance $C_{LL}$ of the test keys in accordance with Eq. (1) based on the resonant frequency measurements.

In the system of the present invention, the near-field microwave probe includes a balanced two-conductor transmission line resonator having a pair of conductors extending in spaced relationship therebetween and separated by a dielectric media.

The system may further include a mechanism for analysis of the calculated microwave capacitance $C_{LL}$ of the test key for determining whether the miniature structure of the integrated circuit under study is defective for fabrication quality control purposes.

These and other novel features and advantages of this invention will be fully understood from the following detailed description of the accompanying Drawings.

BRIEF DESCRIPTION OF THE DRAWINGS

FIGS. 2A, 2B and 2C illustrate test key structures of the present invention;

DESCRIPTION OF THE PREFERRED EMBODIMENT

Figure 1:
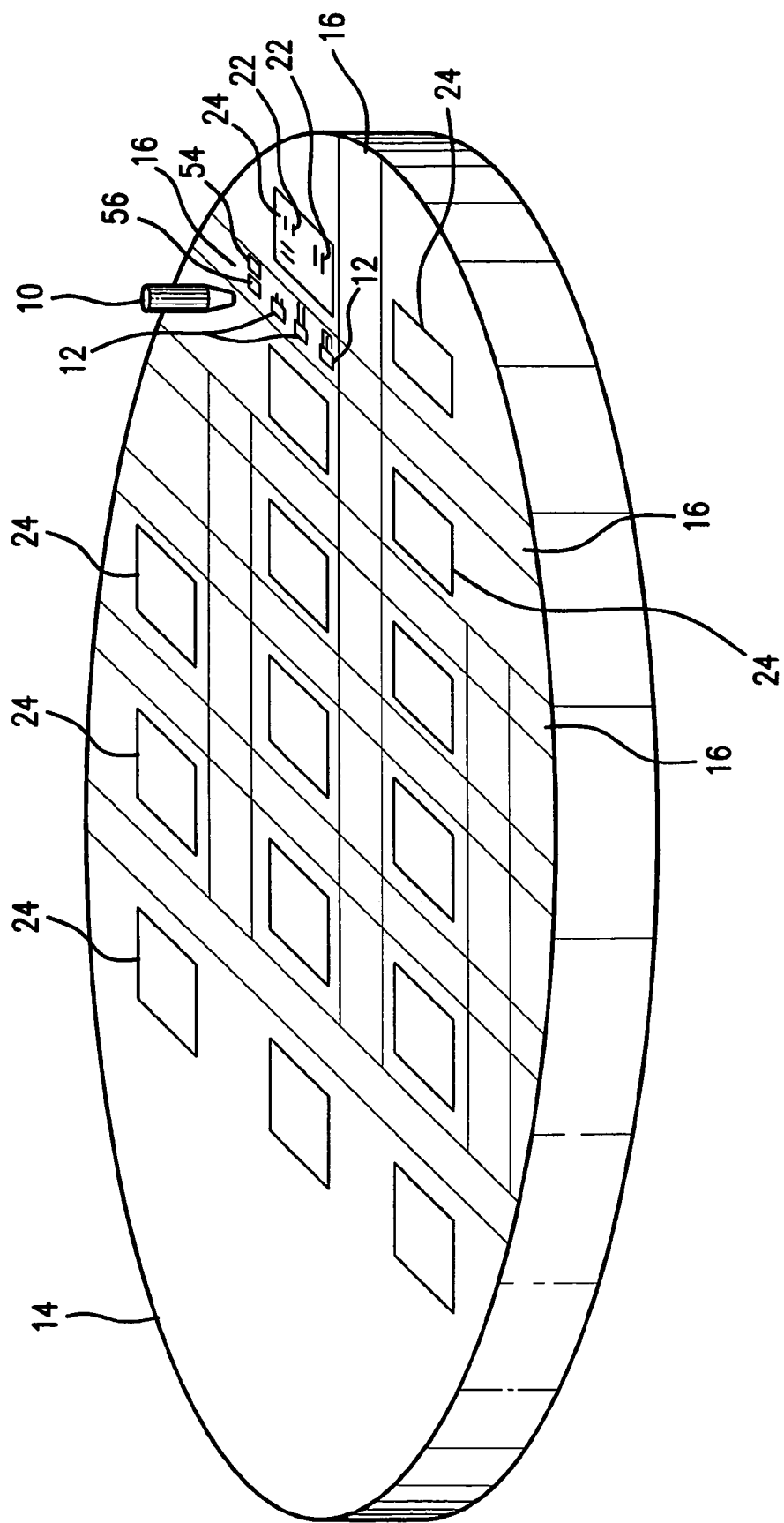
FIG. 1 shows schematically a wafer under test on which test keys and calibration "open" and "short" key structures are built for measurement of microwave capacitance of a chip under study in accordance with the principles of the present invention.

Referring to FIG. 1, a near-field balanced two-conductor probe 10 is used for quantitative non-contact measurement of the microwave capacitance of capacitor test structure 12 patterned on a wafer 14 used for production of integrated circuits. The capacitor test structure 12 of the present invention, also referred to herein as a test key, is a miniature test structure which is built on the wafer 14 to measure capacitance of elements of interest of integrated circuits on the wafer 14. The test keys 12 can be built anywhere on the wafer where a user wants to measure capacitance.

However, it is preferred that the test keys 12 be placed in a test region located in the space called the "scribe line" 16 between chips (dies) 24 on the wafer 14. The scribe line space of a 80 µm in width has as its purpose to permit the chips to be separated from the wafer 14 after the fabrication process has been completed. During fabrication the scribe line can be used as the test region. A plurality of test keys 12 of different dimensions are built in close proximity each to the other for the purposes explained infra herein.

Figure 4A:
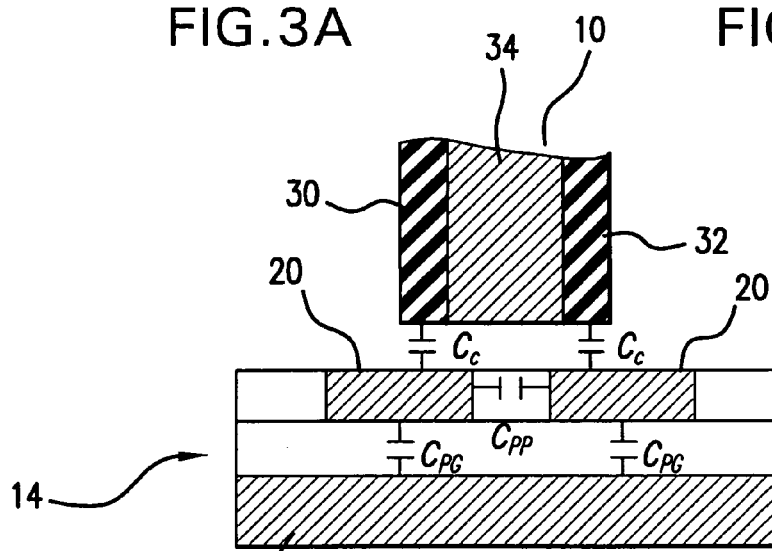
FIGS. 4A and 4B represent schematically a side view (FIG. 4A) and a top view (FIG. 4B) of the near-field microwave measurement scheme of the capacitance test key and show the relative disposition between the test key and the probe.

Each test key 12, as best shown in FIGS. 2A–2C, has pads 18 and test key wires 20, which can extend as parallel wires of length D (FIG. 2A) or designed as a inter-digital comb-like structure (FIGS. 2B, 2C) for the purposes explained in following paragraphs. The wires 20 of the test key 12 are a replica of wires 22 found in the integrated circuit under study. The dimensions of the test key wires 20 (both wire width W and separation S) are designed to match the wires 22 of interest in the integrated circuit 24 defined by a user. If structures 24 on the wafer 14 have an optional ground layer, it must be replicated in all the test keys, as well as in the "open" and "short" calibration keys, as shown in FIG. 4A (ground layer 26). The number of pads 18 may range from 2 and higher. However, for simplicity of explanation, the test key with a pair of pads 18 will be presented herein.

The probe 10, in accordance with the method of the present invention, is brought into close proximity to the test key 12 and fixedly positioned by means of a closed loop distance control mechanism such as shear-force or atomic force based distance control mechanism as will be further disclosed in detail.

Figure 4B:
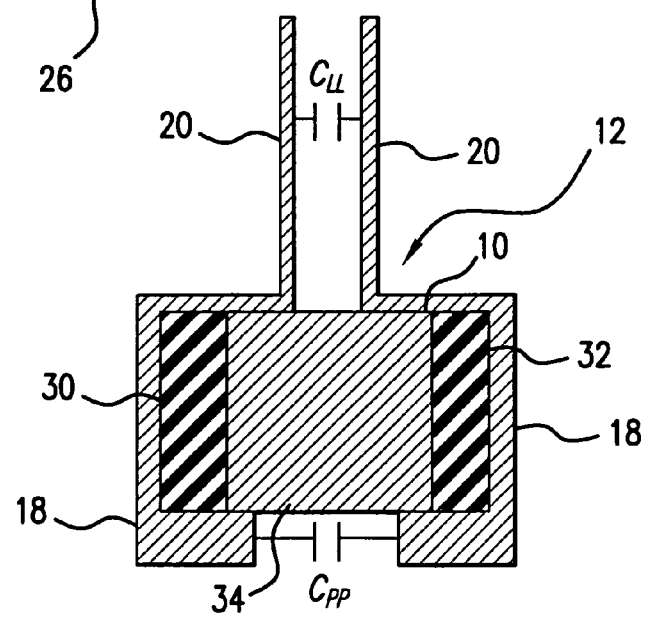
Figure 5:
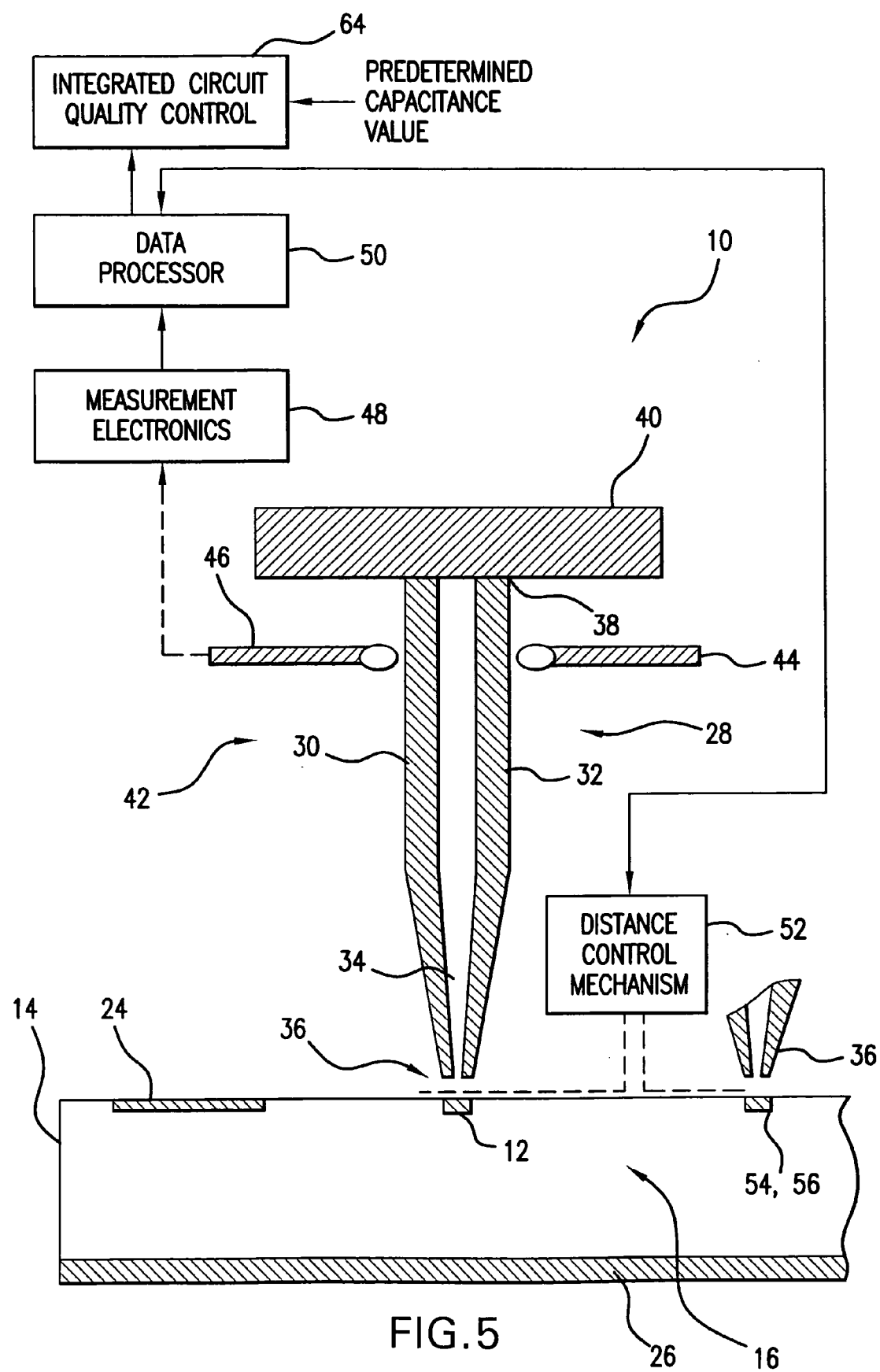
FIG. 5 schematically depicts a system of the present invention forming a two-conductor transmission line resonator with a probe end used for measurement of capacitance of a miniature test structure.

The near-field probe 10, shown in FIGS. 1 and 4A–5, used in the method and system of the present invention for non-destructive determination of the microwave capacitance of the test structure 12 is based on a balanced multi-conductor transmission line 28. As an example, the balanced two-conductor transmission line 28 is shown in FIGS. 4A–5, which includes two spatially separated and symmetrically arranged electrical conductors 30 and 32. The conductors 30 and 32 may have a cylindrical, semi-cylindrical, rectangular, or similar type cross-section contour.

Further, the conductors 30 and 32 may be formed out of copper, tungsten, gold, silver, or aluminum strips deposited onto a probe dielectric 34, such as a tapered glass fiber. A probing end (tip) 36 of the transmission line 28 is brought in close proximity to the test key 12 and an opposing end 38 of the transmission line 28 is either connected to electronics, or terminated by either electrical short or open to form a resonator structure 42. The top end of the structure can be attached mechanically and/or electrically to the plate 40.

The probe 10 may operate as a transmission line for feeding a signal to the test key 12 and measuring the reflected signal to obtain a more sensitive and accurate result while employing less expensive equipment. However, the probe 10 of the present invention is envisioned as a resonator structure 42 which is formed by a portion of the transmission line 28 with the conductors 30 and 32 separated by the dielectric medium 34. The dielectric medium is any low-loss dielectric which may include air, a circulating fluid for temperature stabilization, quartz, or high dielectric constant materials for size reduction. As described in previous paragraphs, the probing end 36 of the resonator structure 42 is brought into proximity to the test key 12. The resonator structure 42 is formed in order to measure the resonant frequency of the resonator structure 42 for determination of the microwave capacitance of the test key 12 as will be described in detail infra.

The spacing between the two conductors 30 and 32 and their cross-section must be properly chosen for accurate measurement. For instance, the spacing between the conductors 30 and 32 may be on the order of or greater than 1 mm at the top of the resonator and tapered down to a size on the order of the test structure (as small at 50 nm).

The coupling to the resonator 42 is provided by a coupling loop 44 positioned close to the resonator 42. The coupling loop 44 is internal to an optional conducting sheath (not shown). An optional second coupling loop 46 may be used for measurement electronics 48 schematically shown in FIG. 5. All calculations are carried out by data processor 50 based on predetermined formulas applied to the measured data. The processor 50 additionally controls the overall performance and operation of the measurement electronics 48 and a distance control mechanism 52.

The resonator structure 42 forms a $(2n+1)\lambda/4$ or $(n+1)\lambda/2$ resonator (n=0,1,2, . . . ), and its length is determined by the frequency of the lowest mode, e.g., about 25 mm for the $\lambda/2$ mode operating at 4 GHz and quartz dielectric.

The resonator structure 42 may be enclosed in a cylindrical sheath formed of a highly conductive material, such as Cu, Au, Ag, Al). The sheath eliminates both radiation from the resonator 42 and the effect of the probe environment on the resonator characteristics. In particular, the changing influence of moving parts in the proximity of resonator 42 is eliminated. Additionally, the sheath has an opening near the test structure area which allows for an efficient coupling of the test structure 12 to the resonator 42.

Where the spacing between the conductors 30 and 32 is small in comparison to the inner diameter of the sheath the resonator properties are substantially unaffected by the sheath's presence. The upper portion of the sheath makes electrical contact with the terminating plate 40. The bottom portion of the sheath may have a conical shape in order to provide clear physical and visual access to the sampling area.

As discussed in previous paragraphs, the probing end 36 of the resonator structure 42 is brought into close proximity to the pads 18 of the test key 12 for measurement purposes. The geometry of the probing end (tip) 36, as well as separation between the tip 36 and the test key 12 is important to the technique of the present invention for quantitative measurements of the capacitance of the test key. Since the accurate determination of these parameters is difficult and often impractical, especially for the very small tips (of less than or on the order of a few microns in size), the quantitative measurements of the present invention are performed without any knowledge of either the actual tip geometry or the absolute tip to structure separation. The quantitative measurements are made by employing an independent distance control mechanism 52 schematically shown in FIG. 5 and described in detail infra.

As shown in FIGS. 4A and 5, the electrical conductors 30 and 32 of the probe 10 are brought into close proximity to the test key 12. However, they are separated by a small unknown distance, for instance, 50–100 nm. They are capacitively coupled to the structure on the wafer 14 via the microwave displacement current without making any physical contact.

Figures 3A, 3B:
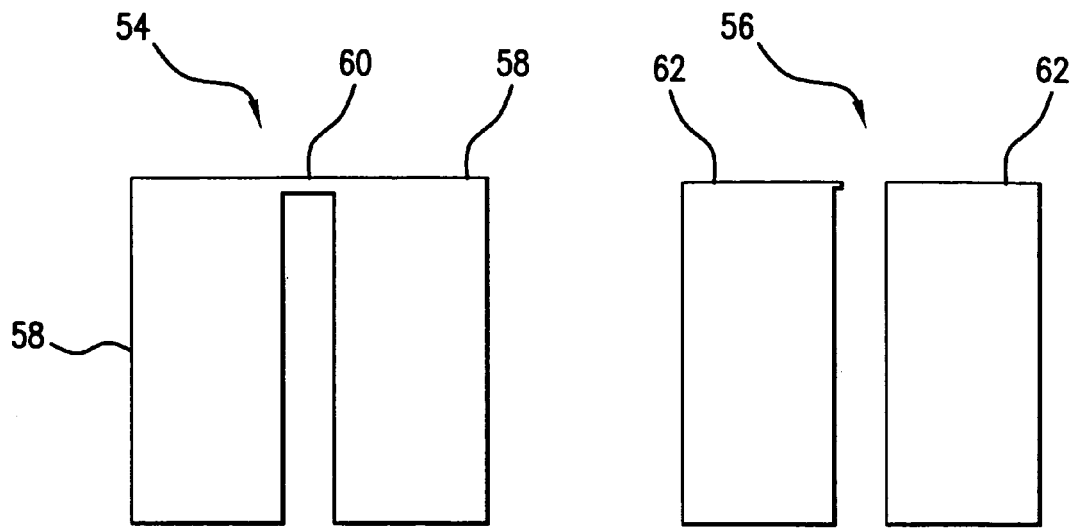
FIGS. 3A and 3B represent respectively "short" and "open" calibration key structures.

Because the Near Field Microwave Probe is sensitive to changes of the tip capacitance on the order of to 0.1 aF ($10^{-19}$F), it is possible to use the probe 10 to measure the lumped element capacitance of very small metallized structures (test keys 12) with typical capacitance on the order of a few femto-Farads ($10^{-15}$F). The equivalent lumped element scheme of the proposed measurement scheme is shown in FIGS. 4A, 4B. The total capacitance seen by the probe tip 36 is:

$$\frac{1}{C_{tot}} = \frac{2}{C_c} + \frac{1}{C_{PP} + 0.5C_{PG} + C_{LL}} \quad (2)$$

where $C_c$ is the tip-to-pad coupling capacitance, $C_{PP}$ is the pad-to-pad capacitance, $C_{PG}$ is the optional pad-to-ground capacitance, and $C_{LL}$ is the total line-to-line capacitance to be determined. Generally, the tip geometry and the tip-to-sample separation are unknown. Therefore, in order to perform quantitative measurements of the test key capacitor a probe calibration is required. In order to calibrate for the unknown values $C_c$, $C_{PP}$ and $C_{PG}$, "short" and "open" calibration keys 54, 56 are used. The "short" calibration key 54, shown in FIG. 3A, include a pair of metal pads 58 shorted each to the other by a conductive element 60. The "open" calibrating key 56, shown in FIG. 3B, includes a pair of metal pads 62 isolated one from another. The locations of the "short" and "open" calibration keys 54, 56 is in close proximity to the test key 12, as shown in FIG. 1, so that the measurement conditions, e.g., the measured material properties, can be assumed to be the same as those of the test key(s) 12. The tip capacitance for the "short" calibration key 54 is:

$$\frac{1}{C_{sh}} = \frac{2}{C_C} \quad (3)$$

The tip capacitance for the "open" calibration key 56 is:

$$\frac{1}{C_{op}} = \frac{2}{C_C} + \frac{1}{C_{PP} + 0.5C_{PG}} \quad (4)$$

From Eqs. (2)–(4), $C_{LL}$ can be found as follows:

$$C_{LL} = \frac{C_{sh}^2(C_{op} - C_{tot})}{(C_{op} - C_{sh})(C_{sh} - C_{tot})} \quad (5)$$

All quantities in the right hand side of Eq. (5) can be measured experimentally using the Near Field Microwave Probe 10.

Preliminary estimates show that for the best measurement precision the $C_{LL}$ value should be in the range between 0.5 and 5 fF. For typical state-of-the-art interconnect wire geometries this corresponds to the capacitance between two wires that are roughly 10 to 50 microns long. Therefore, the entire test key 12 fits in the scribe line 16 of a production wafer 14. The results of preliminary modeling using Ansoft's High Frequency Structure Simulator (HFFS™) show that the electrical field is mostly concentrated between the two wires 20 of the test key 12.

If the tip size of the probe 10 is much smaller than the radiation wavelength, then the tip-to-sample interaction can be described in terms of the tip lumped element impedance $Z_t = R_t + iX_t$. This tip impedance depends on the sample complex permittivity, the tip geometry, and the tip-sample distance.

Considering the case when such a tip 36 forms an electrically open end of a transmission line, the complex reflection coefficient can be found as follows:

$$\Gamma_t = \frac{Z_t - Z_0}{Z_t + Z_0} = |\Gamma_t| \exp(i\varphi) \cong \exp\left(\frac{2Z_0 R_t}{R_t^2 + X_t^2}\right) \exp\left(-i\frac{2Z_0 X_t}{R_t^2 + X_t^2}\right) \quad (6)$$

where $Z_0$ is the line characteristic impedance, and $Z_0 \ll Z_t$. Eq. (6) shows that the magnitude of $\Gamma_t$ is mostly sensitive to the sample losses, while the phase depends mostly on the reactive part of $Z_t$. For a substantially electrical (e.g. open) tip, $X_t < 0$ (i.e., the reactive impedance is capacitive).

If the loss-less capacitive structure, such as "short" or "open" calibration keys 54, 56, is placed underneath the tip then $R_t = 0, X_t = -1/\omega C_t$, Eq. (6) reduces to:

$$\Gamma = \exp(i 2\omega Z_0 C_t) \quad (7)$$

When the probe transmission line forms a resonator, the resonant condition can be written as follows:

$$\exp(2ihL)\Gamma_t \Gamma_0 = 1 \quad (8)$$

where L is the resonator length, h is the line propagation constant, and $\Gamma_0$ is the complex reflection coefficient from the opposite end of the resonator. Consider a half-lambda resonator with $\Gamma_0 = 1$. From Eqs. (7) and (8), the relationship between the probe resonant frequency F and the tip capacitance $C_t$ can be found as follows:

$$C_t = \frac{1 - 2FL\sqrt{\varepsilon_0 \mu_0 \varepsilon_{eff}}}{2F Z_0} \quad (9)$$

Finally, from Eqs. (5) and (9), the following expression for the line-to-line capacitance $C_{LL}$ can be obtained:

$$C_{LL} = \frac{\left(1 - 2F_{sh} L\sqrt{\varepsilon_0 \mu_0 \varepsilon_{eff}}\right)^2}{2Z_0} \frac{(F_{op} - F_{tot})}{(F_{op} - F_{sh})(F_{sh} - F_{tot})} \quad (10)$$

where $F_{op}$ is the resonant frequency for the "open" calibration key 56, $F_{sh}$ is the resonant frequency for the "short" calibration key 54, $F_{tot}$ is the resonant frequency for test key 12, $Z_0$ is the characteristic impedance of said near field microwave, L is the resonator length, $\varepsilon_0$ is the absolute electric permittivity of a vacuum, $\mu_0$ is the absolute permeability of a vacuum, and $\varepsilon_{eff}$ is the effective dielectric constant of the transmission line that forms the probe.

The measurement of $C_{LL}$ as described are conducted for several test keys 12 having different length D of the test key wires 20. These test keys 12 are built on the wafer 14 in close proximity each to the other The measured $C_{LL}$ is then plotted as a function of the test key wires length D. From this dependence the specific capacitance of the test structure (i.e. the capacitance $C_{LL}$ per unit length) is extracted for the further data processing in application to calculation of capacitances of the miniature structures of interest having specific lengths.

As shown in FIG. 5, in the measurement scheme of the present invention, initially the probe resonant frequency $F_{tot}$ is measured for the test key 12 at some unknown but small tip-to-sample distance typically 10 to 100 nm, and second, for probe calibration purposes, the probe 10 is placed above either the "short" calibration key 54 or the "open" calibration key 56. The tip 36 is held at the same distance above the pads 58 of the calibration key 54 or the pads 62 of the calibration key 56 as it was above the pads 18 of the test key 12 by the distance control mechanism 52. The resonant frequency, $F_{sh}$ or $F_{op}$, is measured. The acquired measured resonant frequencies $F_{tot}$, $F_{op}$ and $F_{sh}$ are used to calculate $C_{LL}$ in accordance with Eq. (10).

The distance control mechanism 52 of the present invention, as shown in FIG. 5, may be an atomic force based distance control mechanism. However, mechanism 52 is preferably a shear-force based distance control mechanism where the tip 36 of the resonant structure 42 is maintained at an unknown, but nominally the same or equal distance both in the measuring of the resonant frequency $F_{tot}$ of the probe 10 for the test key 12 and for the measurement of the resonant frequency $F_{sh}$ and $F_{op}$ of the probe 10 for the calibration keys 54, 56.

In order to perform the quantitative measurements with the near-field microwave probes shown in FIGS. 1 and 4A–5, it is important that the separation between the probe tip 36 and the measured structure (either the test key 12, or the calibration keys 54, 56) be precisely controlled. Without the precise control of this distance, changes in the structure capacitance cannot be distinguished from changes in the distance. To control the distance between the tip 36 and the measured structure (12, 54, 56), the distance control unit 52 shown in FIG. 5, is incorporated into the measurement scheme of the probe 10. The distance control unit 52 is coupled bi-directionally to the data processor 50 for data exchange and for control over the operation of the distance control mechanism 52.

The shear force based distance control mechanism 52 is a distance control mechanism applicable for use in near-field scanning optical microscopy (NSOM). The basic concept of the shear force distance control mechanism is that a probe, specifically the tip 36 thereof, is flexible and is mounted onto and dithered by a piezoelectric element or a quartz tuning-fork oscillator (TFO) with an amplitude from a few nanometers down to a few angstroms. When the tip of such a probe is brought in close proximity to the measured structure surface, which are pads 18 for the test key 12, or the pads 58 for the "short" calibration key 54, or the pads 62 for the "open" calibration key 56, the amplitude of the tip oscillation is damped by interaction between the tip 36 and the measured structure surface. The motion of the tip is detected by an optical beam deflection technique for the piezo element or by a phase-or-amplitude-locked loop for the tuning fork oscillator.

In the measuring technique of the present invention, a housing (not shown) of the microwave probe 10 is attached to the dithering element, piezoelectric, which in turn is supported by a fine piezo stage. Thus, the tip 36 is dithered by the piezoelectric element with an amplitude ranging from a few nanometers down to a few angstroms. The motion of the tip 36 is detected by an optical beam deflection unit which includes a laser generating a laser beam directed via the oscillating tip 36 to a photodetector. As the tip 36 is brought into close proximity to the measured structure, the amplitude of the tip oscillation is changed, i.e., damped, by interaction between the tip 36 and the measured structure 12 which is detected by the photodetector.

Responsive to the change of the amplitude of the tip oscillator, the photodetector generates an output which is a signal indicative of the change in separation between the tip 36 and the measured structure. The signal from the output of the photodetector is supplied to an input of a lock-in amplifier, responsively generating a control signal. The control signal generated at an output is indicative of unwanted changes in the separation between the tip 36 and the measured structure. This control signal is fed to a proportional integral derivative controller which generates a control signal which is fed to the fine piezo Z stage for changing the position thereof in a required direction. The probe attached to the fine piezo Z stage adjusts its position with respect to the test structure in order to reach a predetermined separation between the tip 36 and the measured structure (test key 12, "short" calibration key 54, or "open" calibration key 56).

The photodetector, the lock-in amplifier, the proportional integral derivative controller, and the fine piezo Z stage, in combination with the laser, form a feedback loop which maintains the amplitude of the oscillation of the tip 36 of the probe 10 fixed at a value less than a predetermined maximum amplitude of oscillations, and thus, permits precise distance control down to 1 nm.

In performing the quantitative measurement of resonant frequencies $F_{tot}$, $F_{sh}$, and $F_{op}$, as described in previous paragraphs, the following procedures are performed:

(a) adjust the shear force distance control mechanism 52 in a manner that is capable of holding the tip 36 at some fixed distance d above the pads 18 of the test key 12. Generally, the absolute value of this distance d is not known. However, the distance may be estimated by measuring the shear force signal as a function of the tip-to-sample separation by means of the tip 36 approaching the pads 18 of the test key 12 in the open loop circuitry. It is preferred to maintain the separation d on the order of or less than one-tenth of the dimensions of the tip 36;

(b) measure the resonance frequency $F_{tot}$ of the probe 10 for the test key 12, and submit the measured $F_{tot}$ to the measurement electronics 48;

(c) move the probe 10 towards the "short" contact key 54 to position the tip 36 the same distance d above the pads 58 of the "short" calibration key 54 (the distance between the tip 36 and the pads 58 is controlled by the distance control mechanism 52);

(d) measure the resonant frequency $F_{sh}$ of the probe 10 for the "short" calibration key 54, and submit the measured $F_{sh}$ to the measurement electronics 48;

(e) move the probe 10 towards the "open" calibration key 56 to position the tip 36 the same distance d above the pads 62 of the "open" calibration key 56 (the distance between the tip 36 and the pads 62 is controlled by the distance control mechanism 52);

(f) measure the resonance frequency $F_{op}$ of the probe 10 for the "open" calibration key 56, and submit the measured $F_{op}$ to the measurement electronics 48; and (g) output data corresponding to $F_{tot}$, $F_{sh}$ and $F_{op}$ to the data processor 50 for further calculating the capacitance $C_{LL}$ of the test key 12 in accordance with Eq. (10).

The measurements are conducted for a multiplicity of test keys 12 of different test key wire lengths.

The data processor 50 may also perform operations needed in furtherance of optimizing quality control of the manufactured integrated circuit on the wafer 14. For this purpose, a predetermined capacitance value for the integrated circuit of interest is provided. It is clear to those skilled in the art that the measured $C_{LL}$ of the test key 12 is representative of the capacitance of the integrated circuit of interest. The calculated capacitance $C_{LL}$ may be compared in a block 64 (Integrated Circuit Quality Control) to such a predetermined capacitance value, to permit a decision to be made as to whether the integrated circuit of interest is defective based on deviation of the calculated capacitance $C_{LL}$ of the test key 12 from the predetermined capacitance value.

The potential fault that could be detected using the method of the present invention may include but is not limited to defects as Cu voids, Cu diffusion into the dielectric, dielectric damage at interfaces, sidewall damage between the metal of the wire (or a trench) and the dielectric surrounding the metal, etc.

Referring to FIGS. 2A, 2B and 2C, test keys 12 may be designed in several alternative forms. For example, as shown in FIG. 2A, the test key 12 includes at least a pair of parallel lines 20 embedded into the dielectric of the wafer 14. However, if the test key 12 replicates a structure of interest with a longer length of the wires, and there is a need to keep the overall size of the test key small, the lines 20 of the test key are "folded over", as shown in FIGS. 2B and 2C.

The dimensions of the test keys 12 as well as calibration keys 54, 56 represent an extremely important aspect of the measurement scheme of the present invention. The wires 20 of the test key 12 are meant to replicate typical wires 22 that are found in integrated circuits 24. Thus the test key wire dimensions (both wire width W and separation S) are designed to match the wires 22 of interest in the integrated circuit 24 which is defined based on the user's interest. In this manner, the capacitance measured on the test key 12 is representative of the capacitance between lines in the integrated circuits of interest.

The dimensions of the pads of the test key, as well as those of the calibration keys 54, 56, are determined by the probe geometry. The width b, length a, and separation c for the pads as shown in FIG. 2A, are chosen to closely match the geometry of the two electrodes 30 and 32 of the probe 10. This area is minimized in order to decrease the optional pad-to-ground capacitance $C_{PG}$. However, the pads are dimensioned to be slightly larger (at least 0.5 µm on all sides) than the probe's electrodes 30, 32 in order to avoid edge effects. FIGS. 4A and 4B clearly show dimensional relationship between the probe's electrodes 30, 32 and the pads 18 of the test key 12. It will be readily apparent to those skilled in the art that the pads 58 of the "short" calibration key 54, as well as the pads 62 of the "open" calibration key

56, are formed of the same material and have the same dimensions as the pads 18 of the test key 12.

The values of the line width W and line spacing S are chosen based on the geometries of interest for the integrated circuit being studied. The length (D) is chosen to obtain a total $C_{LL}$ that is roughly in the range 0.5–5 fF in order to optimize the sensitivity of the measurements.

In addition, a series of values of the length D are chosen for a given W/S relationship so that the specific capacitance (i.e. capacitance per unit length) can be determined as the slope of the measured $C_{LL}$ vs. D function.

Given the Near-Field Microwave probe geometries, and geometries of interest for state-of-the-art integrated circuits, the following ranges for the dimensions of the test keys, and calibration keys, are believed to cover the devices of interest:

a: 5–20 μm
b: 2–6 μm
c: 1–10 μm
D: 5–50 μm

These values are for example purposes only and are not intended to limit the scope of protection for the present invention. These values are based on a typical line width of W=0.15 μm and line spacing S ranging from 0.1 to 1 μm. For each a/b/c permutation for the pads, it is necessary to have at least one "open" and one "short" calibration key of the same dimensions for calibration purposes. A detailed list of suggested dimensions is shown in Table 1 for capacitance test keys.

Split Table for Capacitance Test Keys (all dimensions in microns)

| Split | a | b | c | S | D | W |
|---|---|---|---|---|---|---|
| Open | 9 | 3 | 1 | — | — | — |
| Short | 9 | 3 | 1 | — | — | — |
| 1 | 9 | 3 | 1 | 0.09 | 20 | 0.15 |
| 2 | 9 | 3 | 1 | 0.1 | 20 | 0.15 |
| 3 | 9 | 3 | 1 | 0.12 | 20 | 0.15 |
| 4 | 9 | 3 | 1 | 0.15 | 20 | 0.15 |
| 5 | 9 | 3 | 1 | 0.2 | 20 | 0.15 |
| 6 | 9 | 3 | 1 | 0.3 | 20 | 0.15 |
| 7 | 9 | 3 | 1 | 0.6 | 20 | 0.15 |
| 8 | 9 | 3 | 1 | 1 | 20 | 0.15 |
| Open | 12.5 | 3 | 4 | — | — | — |
| Short | 12.5 | 3 | 4 | — | — | — |
| 9 | 12.5 | 3 | 4 | 0.09 | 20 | 0.15 |
| 10 | 12.5 | 3 | 4 | 0.1 | 20 | 0.15 |
| 11 | 12.5 | 3 | 4 | 0.12 | 20 | 0.15 |
| 12 | 12.5 | 3 | 4 | 0.15 | 20 | 0.15 |
| 13 | 12.5 | 3 | 4 | 0.2 | 20 | 0.15 |
| 14 | 12.5 | 3 | 4 | 0.3 | 20 | 0.15 |
| 15 | 12.5 | 3 | 4 | 0.6 | 20 | 0.15 |
| 16 | 12.5 | 3 | 4 | 1 | 20 | 0.15 |
| Open | 17 | 4 | 6 | — | — | — |
| Short | 17 | 4 | 6 | — | — | — |
| 17 | 17 | 4 | 6 | 0.09 | 20 | 0.15 |
| 18 | 17 | 4 | 6 | 0.1 | 20 | 0.15 |
| 19 | 17 | 4 | 6 | 0.12 | 20 | 0.15 |
| 20 | 17 | 4 | 6 | 0.15 | 20 | 0.15 |
| 21 | 17 | 4 | 6 | 0.2 | 20 | 0.15 |
| 22 | 17 | 4 | 6 | 0.3 | 20 | 0.15 |
| 23 | 17 | 4 | 6 | 0.6 | 20 | 0.15 |
| 24 | 17 | 4 | 6 | 1 | 20 | 0.15 |
| Open | 9 | 3 | 1 | — | — | — |
| Short | 9 | 3 | 1 | — | — | — |
| 25 | 9 | 3 | 1 | 0.1 | 10 | 0.15 |
| 26 | 9 | 3 | 1 | 0.1 | 30 | 0.15 |
| 27 | 9 | 3 | 1 | 0.1 | 40 | 0.15 |
| 28 | 9 | 3 | 1 | 0.2 | 10 | 0.15 |
| 29 | 9 | 3 | 1 | 0.2 | 30 | 0.15 |
| 30 | 9 | 3 | 1 | 0.2 | 40 | 0.15 |
| 31 | 9 | 3 | 1 | 0.3 | 10 | 0.15 |
| 32 | 9 | 3 | 1 | 0.3 | 30 | 0.15 |
| 33 | 9 | 3 | 1 | 0.3 | 40 | 0.15 |
| Open | 12.5 | 3 | 4 | — | — | — |
| Short | 12.5 | 3 | 4 | — | — | — |
| 34 | 12.5 | 3 | 4 | 0.1 | 10 | 0.15 |
| 35 | 12.5 | 3 | 4 | 0.1 | 30 | 0.15 |
| 36 | 12.5 | 3 | 4 | 0.1 | 40 | 0.15 |
| 37 | 12.5 | 3 | 4 | 0.2 | 10 | 0.15 |
| 38 | 12.5 | 3 | 4 | 0.2 | 30 | 0.15 |
| 39 | 12.5 | 3 | 4 | 0.2 | 40 | 0.15 |
| 40 | 12.5 | 3 | 4 | 0.3 | 10 | 0.15 |
| 41 | 12.5 | 3 | 4 | 0.3 | 30 | 0.15 |
| 42 | 12.5 | 3 | 4 | 0.3 | 40 | 0.15 |
| Open | 17 | 4 | 6 | — | — | — |
| Short | 17 | 4 | 6 | — | — | — |
| 43 | 17 | 4 | 6 | 0.1 | 10 | 0.15 |
| 44 | 17 | 4 | 6 | 0.1 | 30 | 0.15 |
| 45 | 17 | 4 | 6 | 0.1 | 40 | 0.15 |
| 46 | 17 | 4 | 6 | 0.2 | 10 | 0.15 |
| 47 | 17 | 4 | 6 | 0.2 | 30 | 0.15 |
| 48 | 17 | 4 | 6 | 0.2 | 40 | 0.15 |
| 49 | 17 | 4 | 6 | 0.3 | 10 | 0.15 |
| 50 | 17 | 4 | 6 | 0.3 | 30 | 0.15 |
| 51 | 17 | 4 | 6 | 0.3 | 40 | 0.15 |
| Open | 9 | 3 | 1 | — | — | — |
| Short | 9 | 3 | 1 | — | — | — |
| 52 | 9 | 3 | 1 | 0.1 | 15 | 0.15 |
| 53 | 9 | 3 | 1 | 0.1 | 25 | 0.15 |
| 54 | 9 | 3 | 1 | 0.1 | 35 | 0.15 |
| 55 | 9 | 3 | 1 | 0.2 | 15 | 0.15 |
| 56 | 9 | 3 | 1 | 0.2 | 25 | 0.15 |
| 57 | 9 | 3 | 1 | 0.2 | 35 | 0.15 |
| 58 | 9 | 3 | 1 | 0.3 | 15 | 0.15 |
| 59 | 9 | 3 | 1 | 0.3 | 25 | 0.15 |
| 60 | 9 | 3 | 1 | 0.3 | 35 | 0.15 |
| Open | 12.5 | 3 | 4 | — | — | — |
| Short | 12.5 | 3 | 4 | — | — | — |
| 61 | 12.5 | 3 | 4 | 0.1 | 15 | 0.15 |
| 62 | 12.5 | 3 | 4 | 0.1 | 25 | 0.15 |
| 63 | 12.5 | 3 | 4 | 0.1 | 35 | 0.15 |
| 64 | 12.5 | 3 | 4 | 0.2 | 15 | 0.15 |
| 65 | 12.5 | 3 | 4 | 0.2 | 25 | 0.15 |
| 66 | 12.5 | 3 | 4 | 0.2 | 35 | 0.15 |
| 67 | 12.5 | 3 | 4 | 0.3 | 15 | 0.15 |
| 68 | 12.5 | 3 | 4 | 0.3 | 25 | 0.15 |
| 69 | 12.5 | 3 | 4 | 0.3 | 35 | 0.15 |
| Open | 17 | 4 | 6 | — | — | — |
| Short | 17 | 4 | 6 | — | — | — |
| 70 | 17 | 4 | 6 | 0.1 | 15 | 0.15 |
| 71 | 17 | 4 | 6 | 0.1 | 25 | 0.15 |
| 72 | 17 | 4 | 6 | 0.1 | 35 | 0.15 |
| 73 | 17 | 4 | 6 | 0.2 | 15 | 0.15 |
| 74 | 17 | 4 | 6 | 0.2 | 25 | 0.15 |
| 75 | 17 | 4 | 6 | 0.2 | 35 | 0.15 |
| 76 | 17 | 4 | 6 | 0.3 | 15 | 0.15 |
| 77 | 17 | 4 | 6 | 0.3 | 25 | 0.15 |
| 78 | 17 | 4 | 6 | 0.3 | 35 | 0.15 |

The method of the present invention may be used for measuring microwave capacitances of different types of test structures such as for instance arrays of trenches, wires, single trench, single wire, inter-digital comb-like capacitor, etc. In these structures, a plurality of types of faults may be detected such as Cu voids, Cu diffusion into dielectric, dielectric damage to interfaces, sidewall damages, etc. by measuring the capacitance of a test structure and comparing such a calculated capacitance to a predetermined capacitance value. By analyzing the deviation of the measured test structure capacitance from such a predetermined capacitance one may determine whether the structure is defective and what type of defect is encountered with the structure under test.

With the method and system for non-contact measurement of the microwave capacitance of test keys, the unique features advantageously permitted by such a technique of the present invention include the measurement at any point in the manufacturing process without making contact with the structure of interest. The method and system is applicable to structures that are small (a few microns or less) as compared to the standard test structures which are typically hundreds of microns. The measurement is sensitive to extremely small changes in capacitance, on the order of 0.1 aF, that allows a precise determination of the capacitance of the test structure.

The resonance frequency $F_{tot}$, $F_{sh}$ and $F_{op}$ is determined by means of one of the techniques known to those skilled in the art.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A method for non-contact measurement of microwave capacitance of miniature structures of interest of integrated circuits under study, comprising the steps of:
    building at least one test key on a wafer of interest, said at least one test key including first pads and a test key portion coupled to said first pads, said test key portion replicating the miniature structure of interest of the integrated circuit, the dimensions of said test key portion falling in a predetermined range of dimensions corresponding to the dimensions of said miniature structure of interest;
    positioning a near-field microwave probe at a predetermined distance from said first pads of said at least one test key;
    measuring a resonant frequency $F_{tot}$ of said near-field microwave probe for said at least one test key;
    building at least one "short" calibration key on the wafer of interest, said "short" calibration key including second pads coupled each to the other by a conducting portion;
    positioning said near-field microwave probe said predetermined distance from said second pads of said at least one "short" calibration key;
    measuring a resonant frequency $F_{sh}$ of said near-field microwave probe for said at least one "short" calibration key;
    building at least one "open" calibration key on the wafer of interest, said "open" calibration key including third pads isolated one from another;
    positioning said near-field microwave probe said predetermined distance from said third pads of said at least one "open" calibration key;
    measuring a resonant frequency $F_{op}$ of said near-field microwave probe for said at least one "open" calibration key; and
    calculating the microwave capacitance $C_{LL}$ of said at least one test key as $$C_{LL} = \frac{\left(1 - 2F_{sh}L\sqrt{\varepsilon_0\mu_0\varepsilon_{eff}}\right)^2}{2Z_0} \frac{(F_{op} - F_{tot})}{(F_{op} - F_{sh})(F_{sh} - F_{tot})}$$

wherein $F_{op}$ is the resonant frequency of said near-field microwave probe for the "open" calibration key, $F_{sh}$ is the resonant frequency of said near field microwave probe for the "short" calibration key, $F_{tot}$ is the resonance frequency of said near-field microwave probe for the test key, $Z_0$ is the characteristic impedance of said near-field microwave probe, L is the resonator length, $\varepsilon_0$ is the absolute electric permittivity of a vacuum, $\mu_0$ is the absolute permeability of a vacuum, and $\varepsilon_{eff}$ is the effective dielectric constant of the transmission line that forms said near-field microwave probe.

2. The method of claim 1, wherein said test key portion includes at least a pair of test key wires and wherein said capacitance $C_{LL}$ is an interlines or line-to-line capacitance.

3. The method of claim 2, further comprising the step of:
    building a plurality of said test keys in proximity each to the other, said test keys having distinctive lengths of said test key wires ranging from 5 µm to 50 µm.

4. The method of claim 3, further comprising the steps of:
    measuring said capacitance $C_{LL}$ for said plurality of test keys having said test key portions of different dimensions, and
    calculating a specific capacitance $C_{LL}$ per unit length of said test key portions.

5. The method of claim 2, wherein the width of said test key wires is approximately 0.15 µm, and spacing between said test key wires is in the range of 0.1–1 µm.

6. The method of claim 1, wherein said test key portion includes at least a pair of wires extending to form a comb-like inter-digital capacitor.

7. The method of claim 1, wherein said near-field microwave probe includes a balanced two-conductor transmission line resonator.

8. The method of claim 1, wherein said near-field microwave probe includes at least a pair of line conductors extending in spaced relationship therebetween and separated by a dielectric medium.

9. The method of claim 8, wherein said first, second and third pads have substantially the same dimensions, said dimensions being determined by dimensions of said at least pair of line conductors.

10. The method of claim 9, wherein said near-field microwave probe includes a tip, wherein an area of said first, second and third pads is at least the size of a cross-section of said tip of said near-field microwave probe.

11. The method of claim 9, wherein the length of each said first, second and third pads is in the range of 5–20 µm, the width of each said first, second and third pads is in the range of 2–6 µm, and the separation between the pads in said first, second and third pads is in the range of 1–10 µm.

12. The method of claim 1, further comprising the steps of:
    positioning said at least one test key at the scribe line on said wafer of interest.

13. The method of claim 1, further comprising the steps of:
    positioning said at least one "short" and said at least one "open" calibration keys in proximity to said at least one test key.

14. The method of claim 1, further comprising the steps of:

maintaining said predetermined distance between said near-field microwave probe and said at least one test key equal to said predetermined distance between said near-field microwave probe and said at least one "short" and said at least one "open" calibration keys by a closed-loop distance control mechanism.

15. The method of claim 14, wherein said closed-loop distance control mechanism includes a shear force-based distance control mechanism.

16. The method of claim 1, wherein said predetermined distance is maintained below 50–100 nm.

17. The method of claim 1, further comprising the steps of:

comparing said calculated microwave capacitance $C_s$ with a predetermined capacitance value, and judging whether said miniature structure is defective based on a deviation of said $C_s$ from said predetermined capacitance value.

18. A system for non-contact measurement of microwave capacitance of miniature structures of integrated circuits, comprising:

a miniature structure of interest located on a wafer under test;

a near-field microwave probe having a tip thereof;

at least one test key built on said wafer under test and including first metallic pads and a test key portion replicating said miniature structure of interest;

at least one "open" calibration key built on said wafer under test and including second metallic pads isolated one from another;

at least one "short" calibration key built on said wafer under test and including third metallic pads shorted each to the other by a conductive element;

a distance control unit operatively coupled to said near-field microwave probe to control a distance from said probe tip to said first, second and third metallic pads;

acquisition means for acquiring resonant frequency $F_{tot}$ of said near-field microwave probe for said at least one test key, resonant frequency $F_{sh}$ of said near-field microwave probe for said "short" calibration key, and resonant frequency $F_{op}$ of said field microwave probe for said "open" calibration key; and processing means for calculating the microwave capacitance $C_{LL}$ of said test key as $$C_{LL} = \frac{\left(1 - 2F_{sh}L\sqrt{\varepsilon_0\mu_0\varepsilon_{eff}}\right)^2}{2Z_0} \frac{(F_{op} - F_{tot})}{(F_{op} - F_{sh})(F_{sh} - F_{tot})}$$

wherein $F_{op}$ is the resonant frequency of said near-field microwave probe for the "open" calibration key, $F_{sh}$ is the resonant frequency of said near field microwave probe for the "short" calibration key, $F_{tot}$ is the resonance frequency of said near-field microwave probe for the test key, $Z_0$ is the characteristic impedance of said near-field microwave probe, L is the resonator length, $\varepsilon_0$ is the absolute electric permittivity of a vacuum, $\mu_0$ is the absolute permeability of a vacuum, and $\varepsilon_{eff}$ is the dielectric constant of the transmission line that forms said near-field microwave probe.

19. The system of claim 18, wherein said near-field microwave probe includes at least a pair of conductors extending in spaced relationship therebetween and separated by a dielectric media, and wherein said first, second and third metallic pads have dimensions determined by dimensions of said at least pair of conductors.

20. The system of claim 18, further comprising a plurality of said test keys built in proximity each to the other on a test zone of said wafer under study, said test keys having distinct test key portions having geometric properties covering the range of the geometric features of a plurality of miniature structures of interest.

* * * * *